United States Patent [19]

Moench

[11] 4,272,830

[45] Jun. 9, 1981

[54] ROM STORAGE LOCATION HAVING MORE THAN TWO STATES

[75] Inventor: Jerry D. Moench, Austin, Tex.

[73] Assignee: Motorola, Inc., Schaumburg, Ill.

[21] Appl. No.: 972,619

[22] Filed: Dec. 22, 1978

[51] Int. Cl.³ .................. G11C 11/40; G11C 13/00
[52] U.S. Cl. ................................. 365/45; 365/103; 365/104; 307/238.8
[58] Field of Search ............... 365/184, 45, 46, 103, 365/104, 182, 183; 307/238

[56] References Cited

U.S. PATENT DOCUMENTS

| | | | |
|---|---|---|---|
| 3,812,478 | 5/1974 | Tomisawa et al. | 365/103 |
| 3,971,055 | 7/1976 | Avai | 340/173 AN |

Primary Examiner—Terrell W. Fears
Attorney, Agent, or Firm—Joe E. Barbee

[57] ABSTRACT

There is provided a read-only memory having a plurality of storage locations wherein more than one binary digit can be stored. The ROM employs field effect transistors having various gate sizes so that the current through the field effect transistors can be controlled by the gain of the transistor. The different levels of current through the different storage locations provide more than two distinct states for each storage location.

10 Claims, 3 Drawing Figures

ROM STORAGE LOCATION HAVING MORE THAN TWO STATES

BACKGROUND OF THE INVENTION

This invention relates, in general, to computer memories, and more particularly, to read-only memories.

Read-only memories (ROMs) are widely used in electronic applications which require information to be permanently stored for reference. As an example, ROMs are used in look-up tables for calculators, as character generators, as hardware arithmetic units for computers, and to permanently store program instructions for digital data processors. Conventional ROM techniques utilize one transistor for each storage location of the ROM. The single transistor can, in some manner, be programmed on or off for two distinct states of operation. It would be desirable to be able to make ROMs in a smaller physical size. If the transistor could be programmed such that it had various states of "on"-ness then more than two distinct states could be stored in one transistor. If four, eight, or sixteen different levels of "on"ness (or current capacity) were programmed, then two, three, or four respectively binary bits of information could be stored in one transistor.

Accordingly, it is an object of the present invention to provide a read-only memory wherein at least some of the storage locations have more than two distinct states.

Another object of the invention is to provide a read-only memory employing field effect transistors wherein some of the gate electrode regions of the field effect transistors are larger than the gate electrode regions of other field effect transistors within the memory.

A further object of the present invention is to provide a read-only memory having field effect transistors, wherein the current through the field effect transistors is changed by changing a transistor parameter such as the width, length, or threshold to provide different states of "on"ness thereby providing memory cells having more than two distinct states.

SUMMARY OF THE INVENTION

In carrying out the above and other objects of the invention, there is provided a read-only memory having a plurality of storage locations. Each storage location is represented by a transistor and when a storage location contains a zero the transistor is typically incomplete. The transistors can have gate electrode regions of varying width, length, or threshold to change the gain of the transistor, thereby affecting the current flow through the transistor. The greater the current through the transistor, the greater binary bit value stored therein.

The subject matter which is regarded as the invention is set forth in the appended claims. The invention itself, however, together with further objects and advantages thereof, may be better understood by referring to the following detailed description taken in conjuction with the accompanying drawings.

DETAILED DESCRIPTION OF THE DRAWINGS

Figure 1:
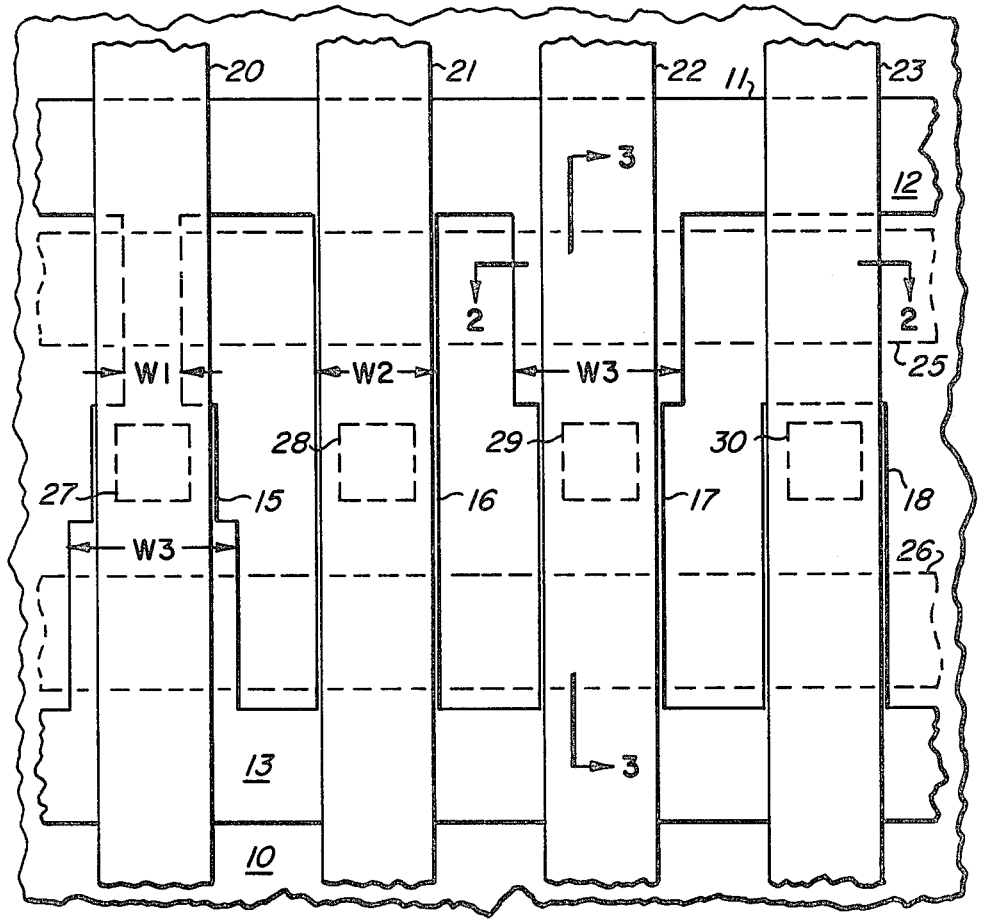
FIG. 1 is a top view illustrative of a portion of a read-only memory embodying the invention in one form thereof.

A portion of a read-only memory (ROM) illustrating an embodiment of the present invention in one form is shown in FIG. 1. By way of example, the ROM is illustrated as having field effect transistors on a P type substrate 10 with gate electrode regions of varying widths. Diffused regions 12 and 13 serve as a plurality of electrodes for field effect transistors and also as an interconnection for the plurality of electrodes. In the portion of the ROM illustrated, diffused regions 12 and 13 are illustrated as being interconnected by interconnecting areas 15, 16, and 17. It should be noted that areas 15, 16, 17, and 18 are not for interconnecting purposes but are formed by the same mask that forms regions 12 and 13. During the process of making the ROM a preohmic opening 27 is provided in area 15, preohmic opening 28 is provided in area 16, preohmic opening 29 is provided in area 17, and preohmic opening 30 is provided in area 18. A polysilicon strip 25 is adjacent to and in parallel with diffused region 12, and polysilicon strip 26 is adjacent to and in parallel with diffused region 13. Polysilicon strip 25 serves as interconnected gate electrodes for one row of field effect transistors while polysilicon strip 26 serves as interconnected gate electrodes for yet another row of field effect transistors. Four metallization strips or metal lines 20, 21, 22, and 23 appear substantially perpendicular to diffused regions 12 and 13 and are superimposed over areas 15 through 18 respectively.

Openings 27 through 30 provide access for metal lines 20 through 23 respectively to make contact with a transistor electrode appearing beneath each respective opening. A storage location can be defined by the area from the top half of opening 27 through diffused region 12. The top half of opening 27 would constitute a first current carrying electrode while diffused region 12 would constitute a second current carrying electrode. The gate electrode for the field effect transistor appearing in this storage location would be formed by the polysilicon strip 25 appearing over the width denoted by W1. Another storage location is defined from the lower half of opening 27 down to diffused region 13 with a first current carrying conductor located beneath the lower half of opening 27 and a second current carrying electrode appearing at diffused region 13. The gate electrode for these two current carrying electrodes appears beneath polysilicon strip 26 and has a width denoted by W3 and can therefore be said to be bounded by an area outlined by W3 and polysilicon strip 26. Other storage locations are defined in similar manners along metal strips 21, 22, and 23. The area of diffused regions 12 and 13 between metal lines 20 through 23 serve to interconnect the field effect transistor electrodes located in diffused regions 12 and 13 beneath metal lines 20 through 23. Note that area 18 does not interconnect diffused regions 12 and 13, although, the area between opening 30 and diffused region 12, along metal strip 23, still defines a storage location. This defined storage location is illustrated as storing a "zero" and accordingly, its gate width is zero or in other words does not exist.

In summary, the portion of the ROM illustrated in FIG. 1 encompasses eight storage locations. The storage locations have gate widths ranging from zero to W3. Width W3 is the widest width and is three times as wide as width W1. Width W2 is two-thirds the width of W3 or twice the width of W1. The ROM, as illustrated in FIG. 1, indicates how four current levels can be programed in an MOS memory device to provide four different levels of "on"ness to yield the capability of storing more than two distinct states in a given storage location. Note that the gate electrode width appearing between opening 27 and diffused region 12 has a width of W1 while the gate electrode width of the gate appearing between opening 27 and diffused region 13 has a width of W3. The two gate electrodes appearing between diffused regions 12 and 13 along metal line 21 both have a width of W2. The gate electrode appearing between opening 29 and diffused region 12 has a width of W3 while the gate electrode between opening 29 and diffused region 13 has a width of W2. The gate electrode appearing between opening 30 and diffused region 13 has a width of W2 and there is no gate electrode appearing between opening 30 and diffused region 12. If the absence of a gate electrode is defined as the storage of binary digits 00, then a gate electrode having a width of W1 denotes the storage of binary digits 01, a gate electrode width of W2 denotes the storage of binary digits 10, and a gate electrode width of W3 denotes the storage of binary digits 11.

In order to vary the length of the gate electrode of one of the transistor memory cells, the area of polysilicon strips 25 and 26 defining the gate electrode region would have to be widened. If it is desired to change the gain of some of the transistors to vary the current therethrough by varying threshold, well known techniques may be used. "Ion Implantation for Threshold Control in COSMOS Circuits", IEEE Transactions on Electron Devices, Vol. ED-21, No. 6, June 1974 sets out one technique and is hereby incorporated herein by reference.

Figure 2:
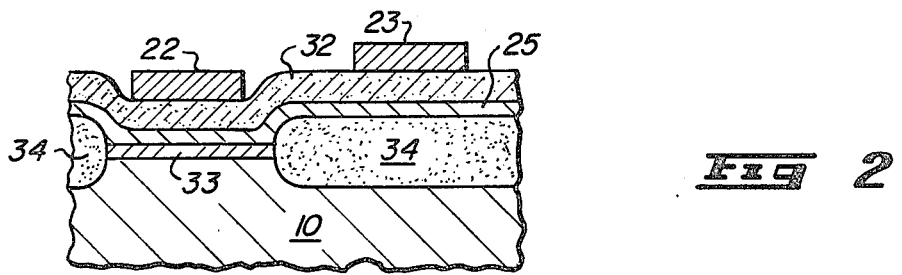
FIG. 2 is a cross-section, along the lines 2—2, of a portion of the ROM illustrated in FIG. 1.

FIG. 2 is a partial cross-section of FIG. 1 along the lines 2—2. Field oxide 34 appears above P type substrate 10. Gate oxide layer 33 appears between P type substrate 10 and polysilicon strip 25. Above gate oxide 33 and separated by oxide layer 32 and polysilicon strip 25 appears metal line 22. Note that metal line 23 does not appear over a gate oxide layer since that particular storage location of the ROM contains a zero and therefore does not have a gate electrode.

Figure 3:
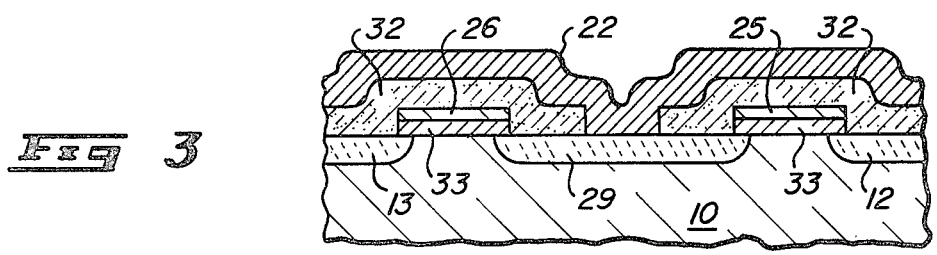
FIG. 3 is a cross-section, along the lines 3—3, of a portion of the ROM illustrated in FIG. 1.

FIG. 3 illustrates in cross-section a portion of the ROM illustrated in FIG. 1 along the arrowed lines 3—3. Substrate 10 shows two N type diffused regions 29 and 12 forming the first and second electrodes of a transistor. Gate oxide layers 33 separate polysilicon gates 25 and 26 from substrate 10. An oxide layer 32 separates polysilicon gates 25 and 26 from metal line 22. As seen in FIG. 3, a field effect transistor is formed by electrode 13, gate 26, and a portion of electrode 29; the other portion of electrode 29 forms anothe field effect transistor along with gate 25 and electrode 12. As explained hereinbefore, each field effect transistor forms a storage location.

A schematic representation of the storage locations illustrated in FIG. 1 could be shown as two series connected field effect transistors having a top source-drain electrode connected to diffused region 12 which in turn could be connected to the lowest voltage potential or ground of the ROM. The two series connected transistors can be said to form a junction therebetween since they each share a common source-drain electrode located beneath the preohmic opening. The junction formed by the two series connected field effect transistors is connected to one of the metal lines 20 through 23 while the other source-drain electrode of the series connected field effect transistor is connected to diffused region 13 which in turn could be connected to a voltage terminal such as ground.

A typical process that could be followed in making the ROM illustrated in FIG. 1 would be to have a first mask in the configuration of diffused regions 12 and 13 and areas 15, 16, 17, and 18. Regions 12 and 13 are diffused along with the areas that will be beneath the preohmic openings. A second mask would provide for the making of polysilicon strips 25 and 26. A third mask could be used to provide openings 27 through 30 which are also known as preohmics. A fourth mask would provide for metal lines 20 through 23.

By now it should be appreciated that there has been provided a novel ROM having a plurality of storage locations with the capability of storing more than two states in each storage location. The capability is provided by changing the gain of the field effect transistor in preselected storage locations. By varying the width of the gate electrode, a transistor located in a storage location can be made to conduct more than one level of current. Since each storage location can store more than two different states the read-only memory can be made much smaller in physical size than heretofore read-only memories. It can be easily seen that the current through the storage location being programmed can be controlled by the W/L (width-to-length) ratio of its field effect transistor. Current reference levels can be generated between the program levels and then detectors or sense amplifiers can be used to determine how much current each storage location is sinking thereby determining which state has been programmed or stored in each storage location. The area used for the ROM can be greatly reduced for the array while the sense amplifiers for the output section would only require a small additional area which would not approach the amount of area saved by being able to store several states in each storage location.

What is claimed is:

1. A read-only memory array having a plurality of storage locations for storing digital information wherein at least one of the storage locations can contain digital information which can be represented by more than one binary digit, comprising: at least a first field effect transistor having a gate electrode region of a first dimension; and at least a second field effect transistor having a gate electrode region of a second dimension so that the second field effect transistor can conduct more current than the first field effect transistor to provide a storage location containing digital information represented by more than one binary digit.

2. The memory array of claim 1 wherein the width of the second field effect transistor is greater than the width of the first field effect transistor.

3. The memory array of claim 1 wherein each storage location containing digital information has a field effect transistor having a gate electrode region, and wherein width of the gate electrode is used to determine value of the digital information stored in each storage location.

4. A read-only memory array having a plurality of storage locations for storing digital information, comprising: at least a first storage location having a first transistor, the first transistor being capable of conducting a predetermined amount of current; and a second storage location having a second transistor, the second transistor being capable of conducting a greater amount of current than the first transistor to provide at least one storage location with capability of storing digital information which is represented by more than one digital bit.

5. The memory array of claim 4 wherein the transistors are field effect transistors each having a gate electrode region.

6. The memory array of claim 4 wherein the current conducting capability is controlled by the threshold voltage of the transistors.

7. A method of making a read-only memory having a plurality of storage locations at least one of which is capable of storing digital information which is represented by more than one digital bit, comprising: forming a plurality of first and second electrode regions on a silicon substrate; and forming gate electrodes of varying size for each pair of first and second electrode regions, the largest size of gate electrode representing the greatest binary value stored.

8. A read-only memory array having a plurality of storage locations for storing digital information, comprising: a silicon substrate; a diffused pattern to form first and second electrodes of transistors; at least one polysilicon strip for forming interconnected gate electrodes of varying size; and at least one metallization strip to interconnect second electrodes of the transistors to provide transistors at storage locations containing digital information, the gate electrodes of varying size allowing some transistors to conduct more current than other transistors thereby providing a read-only memory having at least one storage location capable of storing digital information which is represented by more than one digital bit.

9. The read-only memory array of claim 8 having a plurality of diffused patterns, a plurality of polysilicon strips, and a plurality of metallization strips.

10. The read-only memory array of claim 8 wherein the diffused pattern also interconnects the first electrodes of the transistors.

* * * * *

Disclaimer 4,272,830.—*Jerry D. Moench*, Austin, Tex. ROM STORAGE LOCATING HAVING MORE THAN TWO STATES. Patent dated June 9, 1981. Disclaimer filed Feb. 13, 1984, by the assignee, *Motorola, Inc.*

Hereby enters this disclaimer to claims 4, 5, and 6 of said patent.
[*Official Gazette April 17, 1984.*]